United States Patent [19]
Insley et al.

[11] Patent Number: 5,504,700
[45] Date of Patent: Apr. 2, 1996

[54] METHOD AND APPARATUS FOR HIGH DENSITY SIXTEEN AND THIRTY-TWO MEGABYTE SINGLE IN-LINE MEMORY MODULE

[75] Inventors: Mark Insley, Sunnyvale, Calif.; Stephen Berry, Littleton, Mass.; Jay C. Robinson, Sunnyvale, Calif.

[73] Assignee: Sun Microsystems, Inc., Mountain View, Calif.

[21] Appl. No.: 199,714

[22] Filed: Feb. 22, 1994

[51] Int. Cl.⁶ .................................................. G11C 5/04
[52] U.S. Cl. ..................... 365/52; 365/63; 365/230.03
[58] Field of Search ..................... 365/52, 63, 230.03, 365/51

[56] References Cited

U.S. PATENT DOCUMENTS

| | | | |
|---|---|---|---|
| 5,089,993 | 2/1992 | Neal et al. | 365/52 X |
| 5,164,916 | 11/1992 | Wu et al. | 365/52 |
| 5,272,664 | 12/1993 | Alexander et al. | 365/52 |

*Primary Examiner*—Joseph A. Popek
*Attorney, Agent, or Firm*—Blakely Sokoloff Taylor & Zafman

[57] ABSTRACT

The invention provides a method and apparatus for a memory device interface between a memory device and a CPU as well as the dimensions of the memory device. An electric circuit of the present invention has one-hundred-twenty pins along the length of the housing. The housing of the memory device has a length of approximately 85.6 mm and a width of approximately 54.0 mm. The left and right side socket interface portions of the housing have a minimum width of approximately 3.3 mm. The top socket interface portion has a maximum thickness of approximately 3.5 mm and a minimum height of approximately 3.0 mm. The bottom socket interface portion has a maximum thickness of approximately 5.0 mm and a minimum height of approximately 10.5 mm. Furthermore, the memory device interface portion of the present invention includes at least one pin which provides access to an address signal which indicates a memory array address location within the memory device. The interface portion also includes at least one pin which provides access to a data signal. Additionally, the interface portion includes a row address strobe signal which indicates that the address signal provided to the memory device is a row address, similarly at least one pin providing access to a column address strobe signal is included in the interface portion of the present invention. This column address strobe signal indicates that the address signal provided to the memory device is a column address. Further, at least one pin providing access to a memory write signal and at least one pin providing access to a memory output enable signal are included in the interface portion. Finally, the memory device interface of the present invention provides access to a power supply and to ground.

32 Claims, 6 Drawing Sheets

METHOD AND APPARATUS FOR HIGH DENSITY SIXTEEN AND THIRTY-TWO MEGABYTE SINGLE IN-LINE MEMORY MODULE

BACKGROUND OF THE INVENTION (1) Field of the Invention

The present invention relates to a memory storage device interface between a memory storage device and a computer, wherein the memory storage device interface provides control signals and power to drive data between the memory storage device and the computer with an increased throughput.

(2) Description of Related Art

The term single in-line memory module (SIMM) is used to describe a memory module containing mostly memory chips and no other logic devices with the possible exception of line drivers. SIMMs are small in size and are typically added to an existing computer system through a mating socket. A SIMM may use different types of memory devices in different configurations. Typically, the memory device used is one of two types, static RAM (SRAM), or dynamic RAM (DRAM).

Prior art SIMMs include SIMMs with only eight bits of data. In one version of the SIMM, in order to add memory to a machine incrementally, a minimum of four SIMMs at a time must be inserted into the machine. Another version of a prior art SIMM is one which is double-sided seventy-two pin wide SIMM containing thirty-two bits of data as opposed to only eight bits on the previous version of the SIMM. To add memory to the machine, only one SIMM needs to be inserted at a time as opposed to four SIMMs.

Standard SIMMs include PCMCIA cards (Personal Computer Memory Card International Association) and currently two types of PCMCIA exist. One is a memory card and the other is an IO-type card, such as serial ports and modem cards. The data path for the PCMCIA is only sixteen bits wide. The PCMCIA only supports either SRAM or pseudo-static RAM, and has a sixty-eight pin interface.

With the desire for smaller computers and the ever prevailing need for systems with high resolutions, it is desirable to have a SIMM with a scaled-down dimensions with increased throughput. As will be described, the present invention provides a method and apparatus for a SIMM with a dimensions and interface portion which permits the SIMM to be inserted into smaller computers with limited internal space as well as to permit increased throughput for increased resolutions.

BRIEF SUMMARY OF THE INVENTION

The invention provides a method and apparatus for a memory device interface between a memory device and a CPU as well as the dimensions of the memory device. An electric circuit of the present invention has one-hundred-twenty pins along the length of the housing. The housing of the memory device has a length of approximately 85.6 mm and a width of approximately 54.0 mm. The left and right side socket interface portions of the housing have a minimum width of approximately 3.3 mm. The top socket interface portion has a maximum thickness of approximately 3.5 mm and a minimum height of approximately 3.0 mm. The bottom socket interface portion has a maximum thickness of approximately 5.0 mm and a minimum height of approximately 10.5 mm. Furthermore, the memory device interface portion of the present invention includes at least one pin which provides access to an address signal which indicates a memory array address location within the memory device. The interface portion also includes at least one pin which provides access to a data signal. Additionally, the interface portion includes a row address strobe signal which indicates that the address signal provided to the memory device is a row address, similarly at least one pin providing access to a column address strobe signal is included in the interface portion of the present invention. This column address strobe signal indicates that the address signal provided to the memory device is a column address. Further, at least one pin providing access to a memory write signal and at least one pin providing access to a memory output enable signal are included in the interface portion. Finally, the memory device interface of the present invention provides access to a power supply and to ground.

DETAILED DESCRIPTION OF THE INVENTION

Apparatus and methods for a memory storage device interface between a memory storage device and a computer, and the dimensions of the memory storage device are disclosed. In the following description, for purposes of explanation, specific numbers, chips, etc., are set forth in order to provide a thorough understanding of the present invention. However it will be apparent to one skilled in the art that the present invention may be practiced without these specific details. In other instances, well known circuits and devices are shown in block diagram in order not to obscure the present invention unnecessarily.

Figure 1:
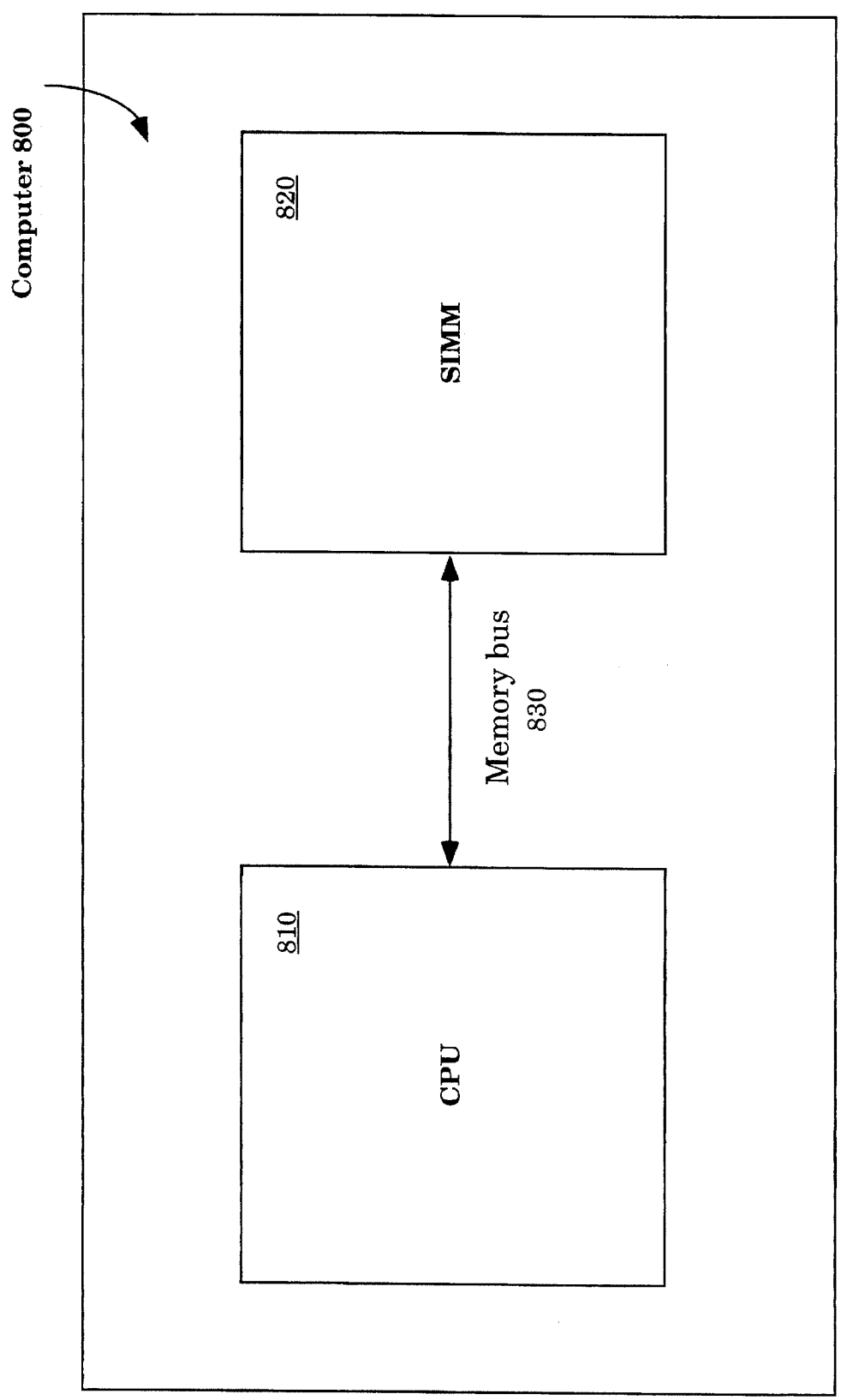
FIG. 1 is a block diagram of a computer system with the invention.
Figure 2:
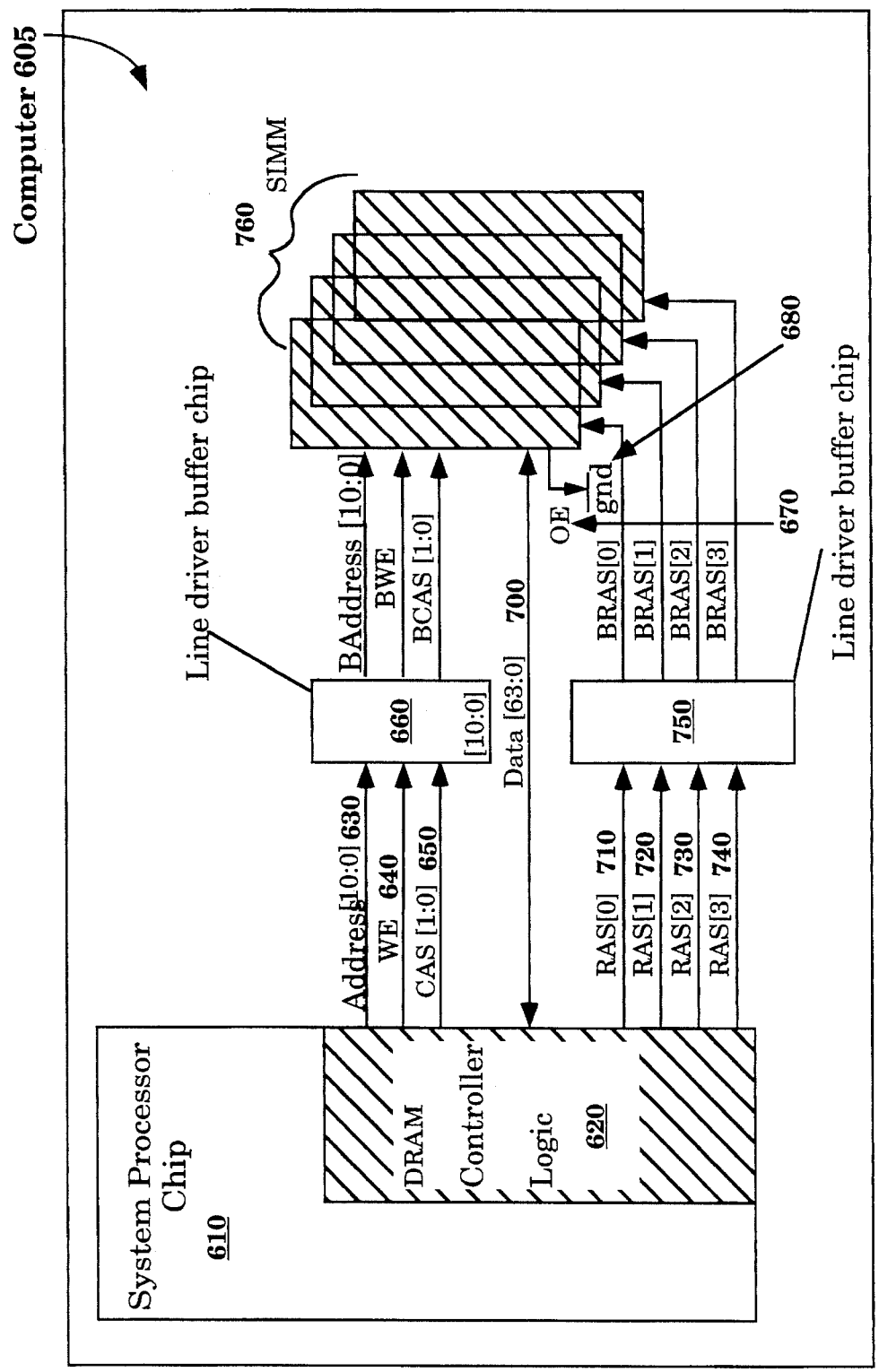
FIG. 2 is a schematic drawing of a memory sub-system of the invention.

FIG. 1 is a block diagram of a computer system with the invention. Computer system 800 has a CPU 810 which is coupled to a SIMM 820 by a memory bus 830. FIG. 2 shows the connection and interaction between the computer system 800 and the SIMM 820 in more detail.

FIG. 2 is a schematic diagram of a memory sub-system of an embodiment of the present invention with 64 data bits. Single in-line memory modules (SIMMs) 760 are connected to a DRAM controller logic 620 of a system processor chip 610. The DRAM controller logic 620 generates a memory address signal driven on address line 630, a write enable (WE) signal provided on WE line 640 and a column address strobe (CAS) signal driven on CAS line 650. These three types of signals are passed through a buffer chip 660 and are driven into the SIMMs 760. In addition, DRAM controller logic 620 generates row address strobe (RAS) signals driven on RAS lines 710 through 740, all driven into a buffer chip 750 and received by individual SIMMs 760.

The data line 700, the address line 630, the write enable line 640 and the CAS line 650 are all shared by the SIMMs 760 that are plugged into a computer system 605. The RAS signals driven on RAS lines 710–740 are unique signals which not only indicate the row address of a memory location inside each respective SIMM, but also indicate which SIMMs the data are to be driven into or read from. In DRAM technology, none of the data lines are enabled unless a RAS line is active. Thus, the address line 630, the data line 700, the write enable line 640, and the CAS line 650 may be toggled or changed, however the data lines are not enabled unless one of the RAS lines 710–740 is active. Thus the RAS signal is used as a SIMM select or a slot select signal as well as a signal to indicate the row address in an individual SIMM.

Figures 3, 4:
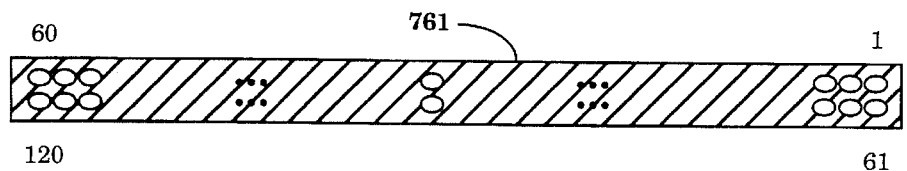
FIG. 3 is a block diagram of an embodiment of the invention with pins and pin numbers.
FIG. 4 is an embodiment of the present invention showing an end view of the body of the present invention.

FIG. 3 illustrates a preferred embodiment of the invention. Each SIMM in the SIMMs 760 is coupled to the computer 605 and signals are driven on pins 1 through 120 of a SIMM. 761 of FIG. 4 is an end view of an embodiment of the present invention.

Now referring back to FIG. 2 in conjunction with FIGS. 3 and 4, each SIMM in the SIMMs 760 is preferably assigned a designated signal or power which corresponds to particular pins illustrated in FIGS. 3 and 4 and are as follows:

Pins 1 and 61 provide a row address strobe (RAS) signal driven on RAS lines 710 and 720 in FIG. 2, which indicate to DRAM controller logic 620 that the address currently on the address pin is a row address.

Pins 2, 25–26, 30–31, 35–36, 59, 62, 86, 90–91, 95, and 119 provide access to ground 680.

Pins 3–10, 17–24, 37–44, 51–58, 63–70, 77–84, 97–104, and 111–118, either provide data contained at an address location within one of the SIMMs 760 to be retrieved during a read cycle, or provide data to one of the SIMMs 760 during a write cycle. Such data are driven on data line 700.

Pins 11, 13, 15–16, 45–46, 48, 50, 71, 73–76, 105–106, and 108–110 provide access to a power supply from computer 605 to SIMMs 760.

Pin 12, 47, 72 and 107 provide access to a column address strobe (CAS) signal provided on CAS line 650, and generated by DRAM controller logic 620. The CAS signal indicates to one of the SIMMs 760 that the address currently on the address input is a column address. When indicating the CAS signal for a particular SIMM, the corresponding RAS signal must also be asserted.

Pin 14 provides access to an output enable (OE) signal driven on the output enable line 670. This output enable signal is left in an asserted (low) state when a read cycle is initiated allowing one of the SIMMs 760 to drive data from the internal memory array onto the data pins.

Pins 27–29, 32–34, 87–89 and 92–93 provide access to the address signals on the address line 630 which indicate which location within the memory array of one of the SIMMs 760 is being accessed by the computer system 605.

Pins 60, 94, and 120 are left unconnected for possible future expansion.

Pin 49 provides access to write enable (WE) signal provided by the DRAM controller logic 620 to one of the SIMMs 760 to indicate whether a read or write of the memory array is to be executed. If the write enable (WE) signal is already asserted (low) by the time the CAS signal is asserted, this indicates a write cycle and data on the data pins are written into one of the SIMMs 760. A read cycle on the other hand is indicated when the write enable signal driven on the write enable line 640 is asserted (high) by the time the CAS signal is asserted.

Pins 85 and 96 provide access to signals that are for parity bits.

The address signals, the write enable signal, the CAS signals, and the RAS signals are all driven into a line driver buffer chip 660 and these buffered signals are then driven into the SIMMs 760.

Figure 5:
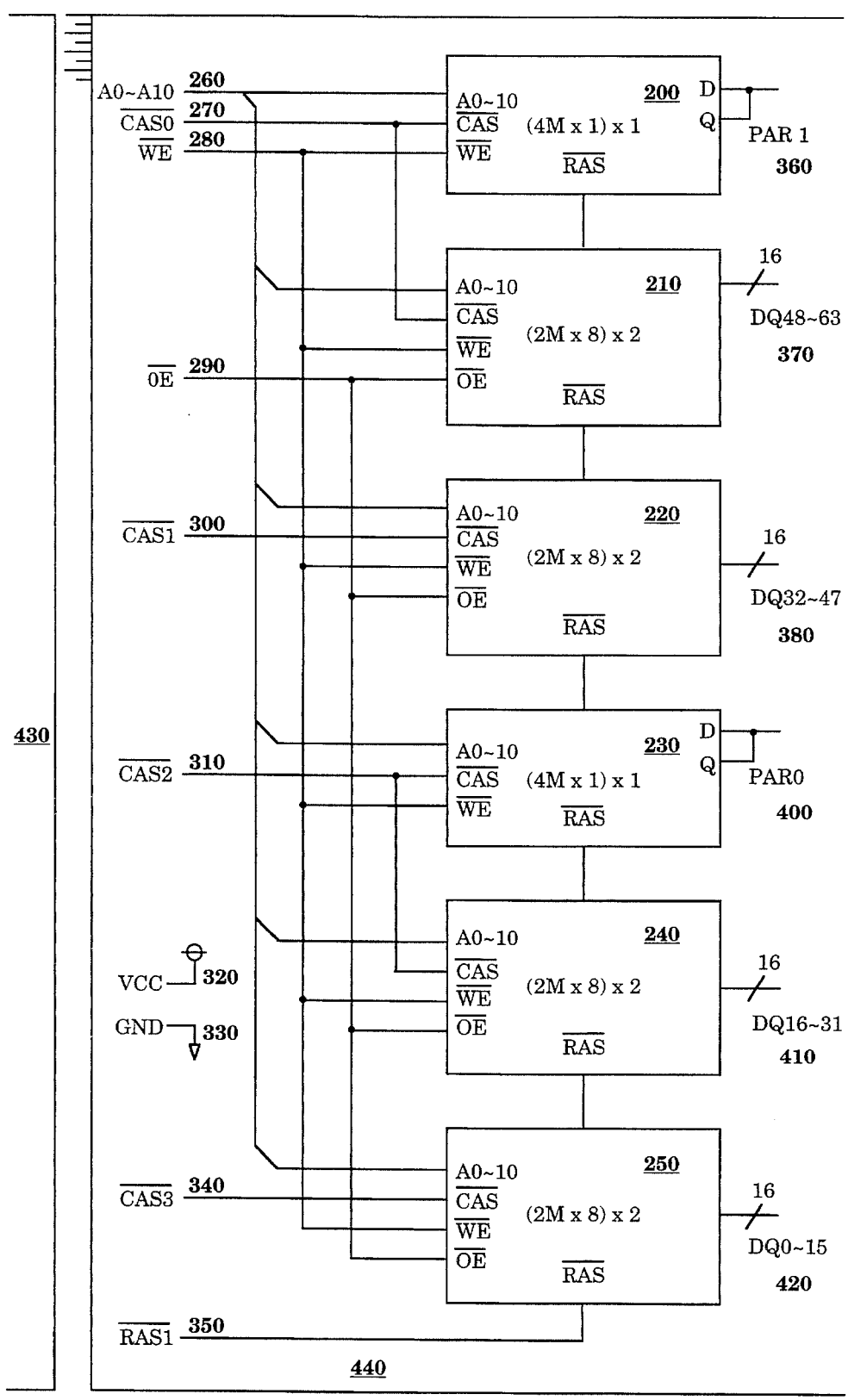
FIG. 5 is a block diagram of a sixteen megabyte embodiment of the invention.

FIG. 5 is a block diagram of an embodiment of the present invention. More specifically, FIG. 5 is a sixteen megabyte embodiment of the present invention. The blocks 200–250 represent memory chips. Block 200 represents one (4M× 1) memory chip, block 210 represents two (2M×8) memory chips, block 220 represents two (2M×8) memory chips, 230 represents one (4M×1) memory chip, 240 represents two (2M× 8) memory chips, and finally block 250 represents two (2M× 8) memory chips. Blocks 200, 210, 220, 230, 240 and 250 all accept address signals A0–A10 260, write enable signal 280 and a RAS signal 350, blocks 200 and 9.10 accept CAS signal 270, block 220 accepts CAS signal 300, blocks 230 and 240 accept CAS signal 310, block 250 accepts CAS signal 340 and finally, blocks 210, 220, 240, and 250 accept output enable signal 290. Blocks 200 and 230 also accept parity inputs 360 and 400. Block 210 accepts or generates data signals DQ48–63 370, block 220 accepts or generates data signals DQ32–47 380, block 240 accepts or generates data signals DQ16–31 410 and block 250 accepts or generates data signals DQ0–15 420. The respective memory blocks are also tied to system power 320 as well as to ground 330. The signals provided to blocks 200, 9.10, 220, 230, 240 and 250 are generated by a computer 430.

This address line 260 indicate where in the SIMM memory array location is to be accessed. The address to be accessed within the memory device 440 is passed to the memory device 440 by the computer 430 in two parts. More specifically, the two parts of the address are the "Row Address" and the "Column Address." Two control inputs RAS 350 and CAS 270, 300, 310 and 340 are provided to the memory device 440 to indicate which of the two address parts is on the address line 260. The RAS signal 350 indicates to the memory device 440 that a row address is on the address line 260. The CAS signals 270, 300, 310 and 340 indicate to the memory device that the address on the address line 260 is a column address. The control signal write enable (WE) 280 indicates to the memory device 440 whether a read of the memory array is to take place or a write to the memory array is to take place. A write cycle is indicated when the write enable signal 280 is already asserted (low) by the time the CAS signals 270, 300, 310 and 340 are asserted. A read cycle is indicated when the write enable signal 280 is not asserted (high) when the CAS signals 270, 300, 310 and 340 are asserted. The output enable 290 is left asserted (low) to permit the memory device 440 to drive data from the memory array onto the data pins when a read cycle is initiated. The data lines 370, 380, 410 and 420 drives data to be stored in the memory device 440 during a write cycle and returns data from the memory device 440 in a read cycle.

Figure 6:
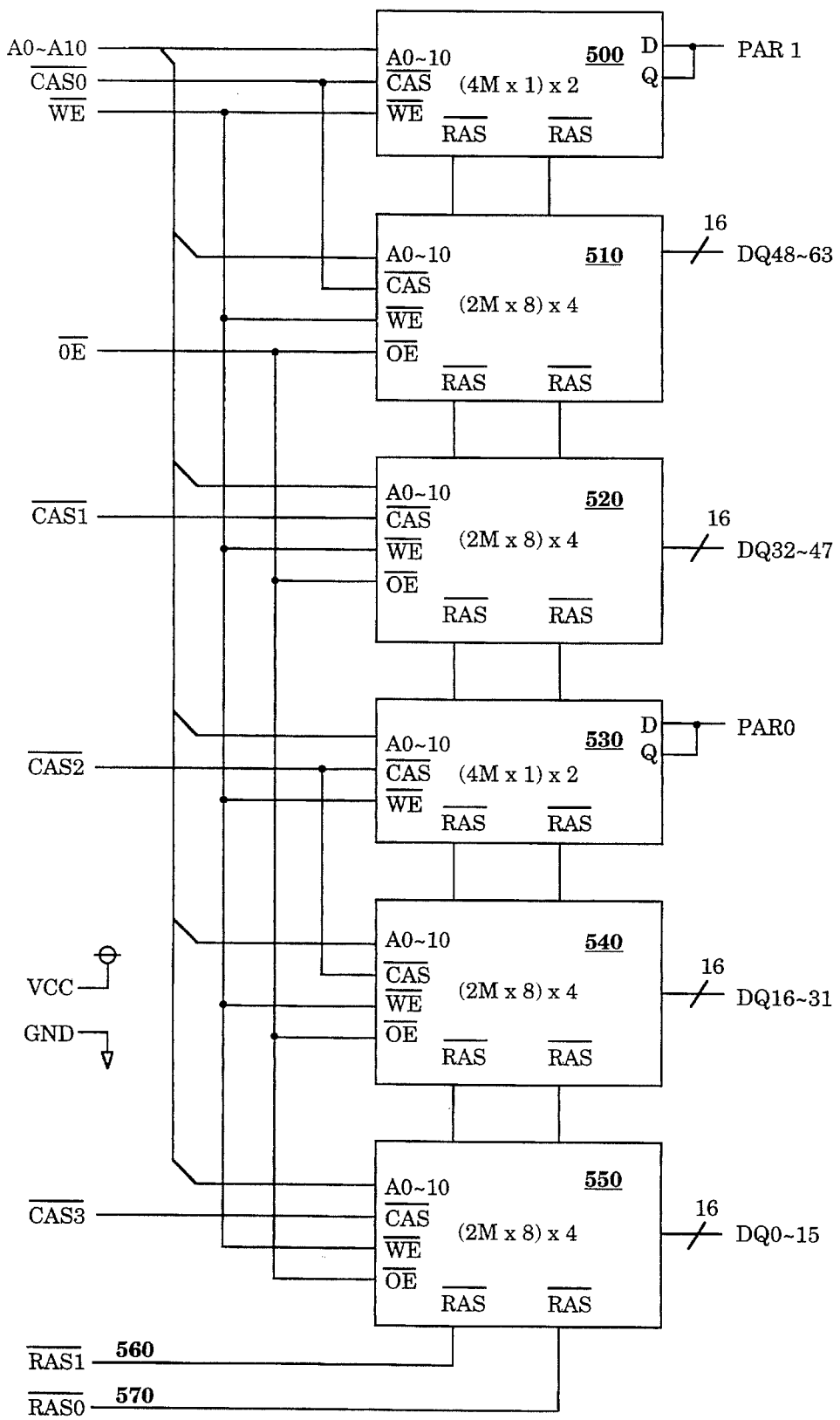
FIG. 6 is a block diagram of a thirty-two megabyte embodiment of the invention.

FIG. 6 illustrates an embodiment of a thirty-two megabyte SIMM. The thirty-two megabyte version of the present invention is essentially a double-sided version of the sixteen megabyte embodiment of the present invention. As such, one side of the memory device will have a sixteen megabyte configuration as was described by the sixteen megabyte embodiment of the present invention in FIG. 5, the other side of the memory device will have the same configuration. Therefore, the block diagram in FIG. 6 illustrates two (4M×1) memory chips for block 500, four (2M×8) memory chips for block 510, four (2M×8) memory chips for block 520, two (4M×1) memory chips for block 530, four (2M×8) memory chips for block 540, and finally four (2M×8) memory chips for block 550. The inputs and outputs of these blocks are similar to the sixteen megabyte embodiment of the present invention with the exception of having two RAS inputs instead of one. The RAS0 signal 570 selects one side of the SIMM of the present invention and the RAS1 signal 560 selects the other side of the SIMM of the present invention.

Figure 7:
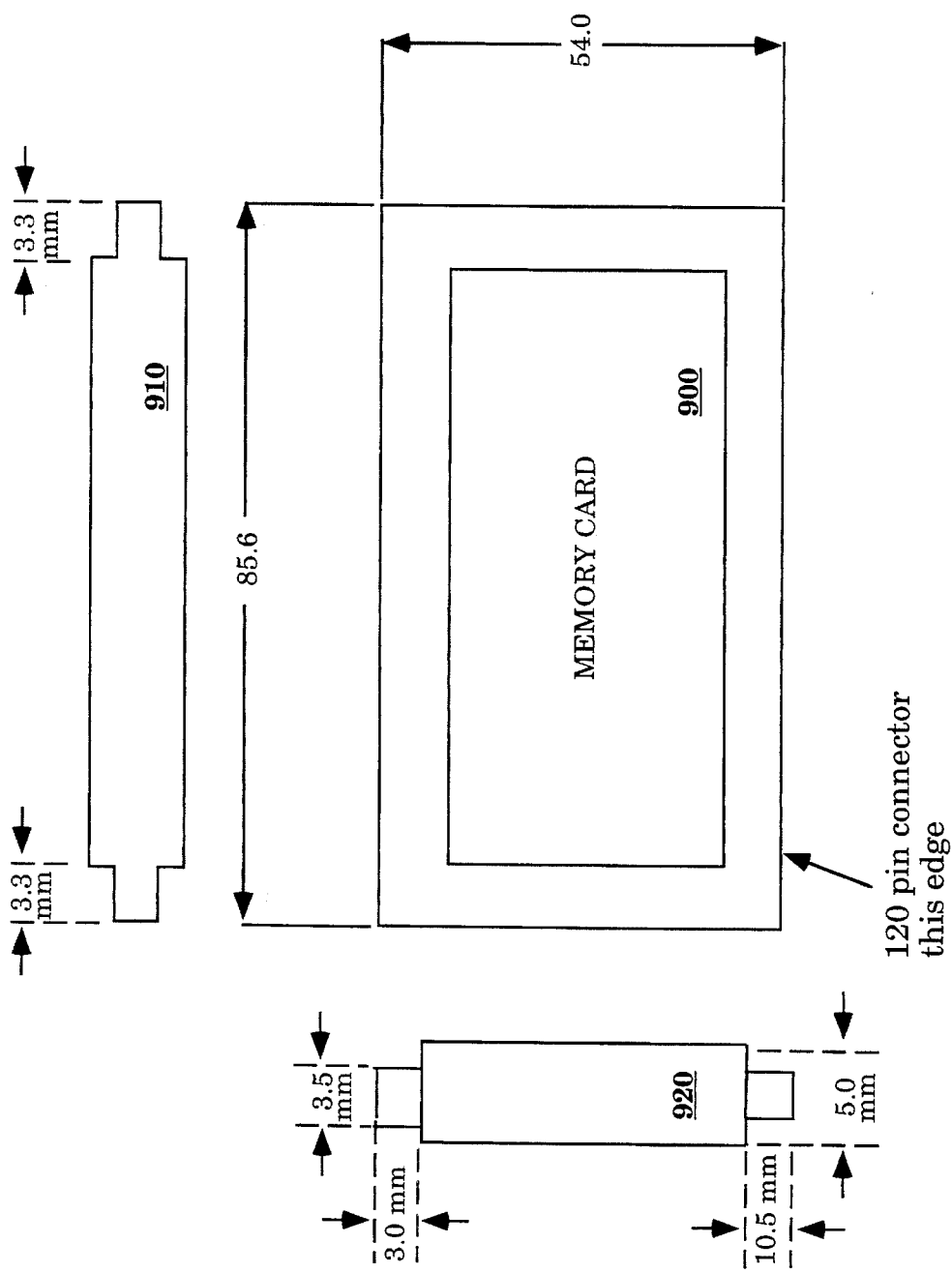
FIG. 7 is an embodiment of the present invention showing the length and width of a housing of the present invention.

FIG. 7 illustrates an embodiment of a housing of the memory storage device of the present invention. The length of the memory device 900 is approximately 85.6 mm and the width is approximately 54.0 mm. The top and bottom length edge view 910 of the memory device 900 shows the side socket interface portions with a minimum width of approximately 3.3 mm. The left and right side edge view 920 of the memory device 900 shows the top portion with a maximum thickness of approximately 3.5 mm and bottom portion with a maximum thickness of approximately 5.0 mm. Additionally, the left and right side edge view 920 of the memory device 900 shows the top portion with a minimum height of approximately 3.0 mm and the bottom portion with a minimum height of approximately 10.5 mm. One-hundred-twenty pins are located on the length of the memory device 900 and as was illustrated in FIG. 4 by the end view 761 of the present invention.

What was described was a memory module with an interface portion for interfacing between the memory module and a computer as well as the dimensions of the memory module. Such interface aspect of the present invention has at least one pin that provides access to each of the following types of signals: an address signal, a data signal, a row address strobe signal, a column address strobe signal, a memory write enable signal and a memory output enable signal. In addition, the interface portion of the present invention also provides access to a power supply from the system as well as to ground.

Although certain preferred embodiments have been described in detail and illustrated in accompanying figures, it is to be understood that such embodiments are merely illustrations and not restrictive on the broad invention. The present invention is not to be limited to the specific arrangements and construction shown and described. Various other modifications may occur to those ordinarily skilled in the art.

What is claimed is:

1. A memory device for use with a computer system, said memory device incorporating a word parity scheme and being capable of providing double sided capacity, comprising:

a housing that has a length of about 85.6 mm and a width of about 54.0 mm;

an electric circuit within said housing and one-hundred-twenty pins which extend along said length of said housing;

a first set of at least one pin providing access to at least one row address strobe signal generated by the system that indicates to the memory device that the row address is on an address line, only one of said at least one row address strobe signal being necessary for selecting a side of said memory device with said double sided capacity;

a first set of at least one pin providing the memory device with access to ground followed in sequence by a first set of at least one pin providing access to a predetermined signal generated by the memory device containing data located in a predetermined memory array address location during a read cycle and providing access to a predetermined signal generated by the system containing data to be stored in said memory device during a write cycle followed in sequence by a first set of at least one pin providing access to a power supply from the system and accepted by the memory device followed in sequence by a first set of at least one pin providing access to a column address strobe signal generated by the system that indicates to the memory device that a column address is on the address line;

a second set of at least one pin providing access to said power supply from the system and accepted by the memory device followed in sequence by a first set of at least one pin providing access to a memory output enable signal generated by the system and accepted by the memory device followed in sequence by a third set of at least one pin providing access to said power supply;

a fourth set of at least one pin providing access to said power supply from the system and accepted by the memory device followed in sequence by a second set of at least one pin providing access to a predetermined signal generated by the memory device containing data located in a predetermined memory array address location during a read cycle and provides access to a predetermined signal generated by the system containing data to be stored in said memory device during a write cycle followed in sequence by a second set of at least one pin providing access to ground;

a third set of at least one pin providing the memory device with access to ground followed in sequence by a first set of at least one pin providing access to a signal generated by the system and accepted by the memory device indicating a predetermined memory array address location within the memory device to be accessed followed in sequence by a fourth set of at least one pin providing access to ground;

a fifth set of at least one pin providing access to said power supply from the system and accepted by the memory device followed in sequence by a first set of at least one pin providing access to a memory write enable signal generated by the system and accepted by the memory device;

a sixth set of at least one pin providing access to said power supply from the system and accepted by the memory device followed in sequence by a third set of at least one pin providing access to a predetermined signal generated by the memory device containing data located in a predetermined memory array address location during a read cycle and provides access to a predetermined signal generated by the system containing data to be stored in said memory device during a write cycle followed in sequence by a first set of at least one pin providing access to parity data; and a second set of at least one pin providing access to parity data signal followed in sequence by a second set of at least one pin providing access to a predetermined signal generated by the memory device containing data located in a predetermined memory array address location during a read cycle and provides access to a predetermined signal generated by the system containing data to be stored in said memory device during a write cycle followed in sequence by a seventh set of at least one pin providing access to a power supply.

2. The memory device of claim 1 wherein said first set of at least one pin providing access to a row address strobe signal further comprises:

pins 1 and 61 which provide access to a row address strobe signal generated by the system and accepted by the memory device that indicate that a row address is on the address line.

3. The memory device of claim 1 wherein said first set of at least one pin providing the memory device with access to ground followed in sequence by said first set of at least one pin providing access data signal located in or to be stored in a predetermined memory array address location followed in sequence by said first set of at least one pin providing access to said power supply followed in sequence by said first set of at least one pin providing access to a column address strobe signal further comprises:

pin 2 which provides the memory device with access to ground;

pins 3–10 which provide access to a signal generated by the memory device that contains data located in a memory array address location during a read cycle and provide access to a signal generated by the system that contains data to be stored in said memory device during a write cycle;

pin 11 which provides access to a power supply from the system and accepted by the memory device;

pin 12 which provides access to a column address strobe signal generated by the system that indicates to the memory device that a column address is on the address line;

pin 36 which provide the memory device with access to ground;

pins 37–44 which provide access to a signal generated by the memory device that contains data located in said memory array address location during a read cycle and provide access to a signal generated by the system that contains data to be stored in said memory device during a write cycle;

pins 45–46 which provide access to a power supply from the computer and accepted by the memory device;

pin 47 which provides access to a column address strobe signal generated by the system that indicates to the memory device that a column address is on the address line;

pin 62 which provides the memory device with access to ground;

pins 63–70 which provide access to a signal generated by the memory device that contains data located in said memory array address location during a read cycle and provide access to a signal generated by the system that contains data to be stored in said memory device during a write cycle;

pin 71 which provides access to a power supply from the computer and accepted by the memory device; and pin 72 which provides access to a column address strobe signal generated by the system that indicates to the memory device that a column address is on the address line.

4. The memory device of claim 1 wherein said second set of at least one pin providing access to said power supply followed in sequence by said first set of at least one pin providing access to a memory output enable signal followed in sequence by said third set of at least one pin providing access to said power supply further comprises:

pin 13 which provides access to a power supply from the system and accepted by the memory device;

pin 14 which provides access to a memory output enable signal generated by the system and accepted by the memory device; and pin 15 which provides access to a power supply from the system and accepted by the memory device.

5. The memory device of claim 1 wherein said fourth set of at least one pin providing access to said power supply followed in sequence by said second set of at least one pin providing access to a predetermined data signal located in or to be stored in a predetermined memory array address location followed in sequence by said second set of at least one pin providing access to ground further comprises:

pin 16 which provides access to a power supply from the system and accepted by the memory device;

pins 17–24 which provide access to a signal generated by the memory device that contains data located in said memory array address location during a read cycle and provide access to a signal generated by the system that contains data to be stored in said memory device during a write cycle;

pin 25 which provides the memory device with access to ground;

pin 50 which provides access to a power supply from the system and accepted by the memory device;

pins 51–58 which provide access to a signal generated by the memory device that contains data located in said memory array address location during a read cycle and provide access to a signal generated by the system that contains data to be stored in said memory device during a write cycle;

pin 59 which provides the memory device with access to ground;

pins 108–110 which provide access to a power supply from the system and accepted by the memory device;

pins 111–118 which provide access to a signal generated by the memory device that contains data located in said memory array address location during a read cycle and provide access to a signal generated by the system that contains data to be stored in said memory device during a write cycle; and pin 119 which provides the memory device with access to ground.

6. The memory device of claim 1 wherein said third set of at least one pin providing the memory device with access to ground followed in sequence by said first set of at least one pin providing access to a predetermined address signal followed in sequence by said fourth set of at least one pin providing access to ground further comprises:

pin 26 which provides the memory device with access to ground;

pins 27–29 which provide access to a signal generated by the system and accepted by the memory device indicating the memory array address location within the memory device to be accessed;

pins 30–31 which provide the memory device with access to ground;

pins 32–34 which provide access to a signal generated by the system and accepted by the memory device that indicates to the memory device the memory array address location within the memory device to be accessed;

pin 35 which provide the memory device with access to ground;

pin 86 which provides the memory device with access to ground;

pins 87–89 which provide access to a signal generated by the system and accepted by the memory device indicating the memory array address location within the memory device to be accessed;

pins 90–91 which provide the memory device with access to ground;

pins 92–93 which provide access to a signal generated by the system and accepted by the memory device indicating the memory array address location within the memory device to be accessed; and pin 95 which provides the memory device with access to ground.

7. The memory device of claim 1 wherein said fifth set of at least one pin providing access to said power supply followed in sequence by said first set of at least one pin providing access to a memory write enable signal further comprises:

pin 48 which provides access to a power supply from the system and accepted by the memory device; and pin 49 which provides access to a memory write enable signal generated by the system and accepted by the memory device.

8. The memory device of claim 1 wherein said sixth set of at least one pin providing access to said power supply followed in sequence by said third set of at least one pin providing access to a predetermined data signal located in or to be stored in a predetermined memory array address location followed in sequence by said first set of at least one pin providing access to parity data further comprises:

pins 73–76 which provide access to a power supply from the computer and accepted by the memory device;

pins 77–84 which provide access to a signal generated by the memory device that contains data located in said memory array address location during a read cycle and provide access to a signal generated by the system that contains data to be stored in said memory device during a write cycle; and pin 85 which provides access to a parity bit.

9. The memory device of claim 1 wherein said second set of at least one pin providing access to parity data followed in sequence by said second set of at least one pin providing access to a predetermined data signal located in or to be stored in a predetermined memory array address location followed in sequence by said seventh set of at least one pin providing access to said power supply further comprises:

pin 96 which provides access to a parity bit;

pins 97–104 which provide access to a signal generated by the memory device that contains data located in said memory array address location during a read cycle and provide access to a signal generated by the system that contains data to be stored in said memory device during a write cycle; and pins 105–106 which provide access to a power supply from the system and accepted by the memory device.

10. The memory device of claim 1 further comprising:

pins 60, 94 and 120 which are left unconnected and reserved for future expansion of the memory device.

11. The memory device of claim 1 wherein said housing has side socket interface portions with a minimum width of approximately 3.3 mm.

12. The memory device of claim 1 wherein said housing has a top socket interface portion with a maximum thickness of approximately 3.5 mm and a minimum height of approximately 3.0 mm.

13. The memory device of claim 1 wherein said housing has a bottom socket interface portion with a maximum thickness of approximately 5.0 mm and a minimum height of approximately 10.5 mm.

14. The memory device of claim 1 further comprising a pin 107 which provides access to a column address strobe signal generated by the system that indicates to the memory device that a column address is on the address line.

15. A method for providing a memory device for use with a computer system, said memory device incorporating a word parity scheme and being capable of providing double sided capacity, comprising the steps of:

providing a memory device interface for coupling to the computer system including:

a housing that has a length of about 85.6 mm and a width of about 54.0 mm;

an electric circuit within said housing and one-hundred-twenty pins which extend along said length of said housing;

a first set of at least one pin providing access to at least one row address strobe signal generated by the system that indicates to the memory device that the row address is on an address line, only one of said at least one row address strobe signal being necessary for selecting a side of said memory device with said double sided capacity;

a first set of at least one pin providing the memory device with access to ground followed in sequence by a first set of at least one pin providing access to a predetermined signal generated by the memory device containing data located in a predetermined memory array address location during a read cycle and providing access to a predetermined signal generated by the system containing data to be stored in said memory device during a write cycle followed in sequence by a first set of at least one pin providing access to a power supply from the system and accepted by the memory device followed in sequence by a first set of at least one pin providing access to a column address strobe signal generated by the system that indicates to the memory device that a column address is on the address line;

a second set of at least one pin providing access to said power supply from the system and accepted by the memory device followed in sequence by a first set of at least one pin providing access to a memory output enable signal generated by the system and accepted by the memory device followed in sequence by a third set of at least one pin providing access to said power supply;

a fourth set of at least one pin providing access to said power supply from the system and accepted by the memory device followed in sequence by a second set of at least one pin providing access to a predetermined signal generated by the memory device containing data located in a predetermined memory array address location during a read cycle and provides access to a predetermined signal generated by the system containing data to be stored in said memory device during a write cycle followed in sequence by a second set of at least one pin providing access to ground;

a third set of at least one pin providing the memory device with access to ground followed in sequence by a first set of at least one pin providing access to a signal generated by the system and accepted by the memory device indicating a predetermined memory array address location within the memory device to be accessed followed in sequence by a fourth set of at least one pin providing access to ground;

a fifth set of at least one pin providing access to said power supply from the system and accepted by the memory device followed in sequence by a first set of at least one pin providing access to a memory write enable signal generated by the system and accepted by the memory device;

a sixth set of at least one pin providing access to said power supply from the system and accepted by the memory device followed in sequence by a third set of at least one pin providing access to a predetermined signal generated by the memory device containing data located in a predetermined memory array address location during a read cycle and provides access to a predetermined signal generated by the system containing data to be stored in said memory device during a write cycle followed in sequence by a first set of at least one pin prodding access to parity data; and a second set of at least one pin providing access to parity data signal followed in sequence by a second set of at least one pin providing access to a predetermined signal generated by the memory device containing data located in a predetermined memory array address location during a read cycle and provides access to a predetermined signal generated by the system containing data to be stored in said memory device during a write cycle followed in sequence by a seventh set of at least one pin providing access to a power supply.

16. The method of claim 15 further comprising the steps of providing:

pins 1 and 61 which provide access to a row address strobe signal generated by the system and accepted by the memory device that indicate that a row address is on the address line;

pin 2 which provides the memory device with access to ground;

pins 3–10 which provide access to a signal generated by the memory device that contains data located in a memory array address location during a read cycle and provide access to a signal generated by the system that contains data to be stored in said memory device during a write cycle;

pin 11 which provides access to a power supply from the system and accepted by the memory device;

pin 12 which provides access to a column address strobe signal generated by the system that indicates to the memory device that a column address is on the address line;

pin 36 which provide the memory device with access to ground;

pins 37–44 which provide access to a signal generated by the memory device that contains data located in said memory array address location during a read cycle and provide access to a signal generated by the system that contains data to be stored in said memory device during a write cycle;

pins 45–46 which provide access to a power supply from the computer and accepted by the memory device;

pin 47 which provides access to a column address strobe signal generated by the system that indicates to the memory device that a column address is on the address line;

pin 62 which provides the memory device with access to ground;

pins 63–70 which provide access to a signal generated by the memory device that contains data located in said memory array address location during a read cycle and provide access to a signal generated by the system that contains data to be stored in said memory device during a write cycle;

pin 71 which provides access to a power supply from the computer and accepted by the memory device;

pin 72 which provides access to a column address strobe signal generated by the system that indicates to the memory device that a column address is on the address line;

pin 13 which provides access to a power supply from the system and accepted by the memory device;

pin 14 which provides access to a memory output enable signal generated by the system and accepted by the memory device;

pin 15 which provides access to a power supply from the system and accepted by the memory device;

pin 16 which provides access to a power supply from the system and accepted by the memory device;

pins 17–24 which provide access to a signal generated by the memory device that contains data located in said memory array address location during a read cycle and provide access to a signal generated by the system that contains data to be stored in said memory device during a write cycle;

pin 25 which provides the memory device with access to ground;

pin 50 which provides access to a power supply from the system and accepted by the memory device;

pins 51–58 which provide access to a signal generated by the memory device that contains data located in said memory array address location during a read cycle and provide access to a signal generated by the system that contains data to be stored in said memory device during a write cycle;

pin 59 which provides the memory device with access to ground;

pins 108–110 which provide access to a power supply from the system and accepted by the memory device;

pins 111–118 which provide access to a signal generated by the memory device that contains data located in said memory array address location during a read cycle and provide access to a signal generated by the system that contains data to be stored in said memory device during a write cycle;

pin 119 which provides the memory device with access to ground;

pin 26 which provides the memory device with access to ground;

pins 27–29 which provide access to a signal generated by the system and accepted by the memory device indicating the memory array address location within the memory device to be accessed;

pins 30–31 which provide the memory device with access to ground;

pins 32–34 which provide access to a signal generated by the system and accepted by the memory device that indicates to the memory device the memory array address location within the memory device to be accessed;

pin 35 which provide the memory device with access to ground;

pin 86 which provides the memory device with access to ground;

pins 87–89 which provide access to a signal generated by the system and accepted by the memory device indicating the memory array address location within the memory device to be accessed;

pins 90–91 which provide the memory device with access to ground;

pins 92–93 which provide access to a signal generated by the system and accepted by the memory device indicating the memory array address location within the memory device to be accessed;

pin 95 which provides the memory device with access to ground;

pin 48 which provides access to a power supply from the system and accepted by the memory device;

pin 49 which provides access to a memory write enable signal generated by the system and accepted by the memory device;

pins 73–76 which provide access to a power supply from the computer and accepted by the memory device;

pins 77–84 which provide access to a signal generated by the memory device that contains data located in said memory array address location during a read cycle and provide access to a signal generated by the system that contains data to be stored in said memory device during a write cycle;

pin 85 which provides access to a parity bit;

pin 96 which provides access to a parity bit;

pins 97–104 which provide access to a signal generated by the memory device that contains data located in said memory array address location during a read cycle and provide access to a signal generated by the system that contains data to be stored in said memory device during a write cycle;

pins 105–106 which provide access to a power supply from the system and accepted by the memory device;

pin 107 which provides access to a column address strobe signal generated by the system that indicates to the memory device that a column address is on the address line; and pins 60, 94 and 120 which are left unconnected and reserved for future expansion of the memory device.

17. The method of claim 15 wherein said housing has side socket interface portions with a minimum width of approximately 3.3 mm.

18. The method of claim 15 wherein said housing has a top socket interface portion with a maximum thickness of approximately 3.5 mm and a minimum height of approximately 3.0 mm.

19. The method of claim 15 wherein said housing has a bottom socket interface portion with a maximum thickness of approximately 5.0 mm and a minimum height of approximately 10.5 mm.

20. A computer system comprising:

a) a memory device for coupling to the computer system, said memory device incorporating a word parity scheme and being capable of providing double sided capacity, and including:

a housing that has a length of about 85.6 mm and a width of about 54.0 mm; and an electric circuit within said housing and one-hundred-twenty pins which extend along said length of said housing;

b) a CPU coupled to said memory device; and c) an interface between said memory device and the computer system, said interface including:

a first set of at least one pin providing access to at least one row address strobe signal generated by the system that indicates to the memory device that the row address is on an address line, only one of said at least one row address strobe signal being necessary for selecting a side of said memory device with said double sided capacity;

a first set of at least one pin providing the memory device with access to ground followed in sequence by a first set of at least one pin providing access to a predetermined signal generated by the memory device containing data located in a predetermined memory array address location during a read cycle and providing access to a predetermined signal generated by the system containing data to be stored in said memory device during a write cycle followed in sequence by a first set of at least one pin providing access to a power supply from the system and accepted by the memory device followed in sequence by a first set of at least one pin providing access to a column address strobe signal generated by the system that indicates to the memory device that a column address is on the address line;

a second set of at least one pin providing access to said power supply from the system and accepted by the memory device followed in sequence by a first set of at least one pin providing access to a memory output enable signal generated by the system and accepted by the memory device followed in sequence by a third set of at least one pin providing access to said power supply;

a fourth set of at least one pin providing access to said power supply from the system and accepted by the memory device followed in sequence by a second set of at least one pin providing access to a predetermined signal generated by the memory device containing data located in a predetermined memory array address location during a read cycle and provides access to a predetermined signal generated by the system containing data to be stored in said memory device during a write cycle followed in sequence by a second set of at least one pin providing access to ground;

a third set of at least one pin providing the memory device with access to ground followed in sequence by a first set of at least one pin providing access to a signal generated by the system and accepted by the memory device indicating a predetermined memory array address location within the memory device to be accessed followed in sequence by a fourth set of at least one pin providing access to ground;

a fifth set of at least one pin providing access to said power supply from the system and accepted by the memory device followed in sequence by a first set of at least one pin providing access to a memory write enable signal generated by the system and accepted by the memory device;

a sixth set of at least one pin providing access to said power supply from the system and accepted by the memory device followed in sequence by a third set of at least one pin providing access to a predetermined signal generated by the memory device containing data located in a predetermined memory array address location during a read cycle and provides access to a predetermined signal generated by the system containing data to be stored in said memory device during a write cycle followed in sequence by a first set of at least one pin providing access to parity data; and a second set of at least one pin providing access to parity data signal followed in sequence by a second set of at least one pin providing access to a predetermined signal generated by the memory device containing data located in a predetermined memory array address location during a read cycle and provides access to a predetermined signal generated by the system containing data to be stored in said memory device during a write cycle followed in sequence by a seventh set of at least one pin providing access to a power supply.

21. The computer system of claim 20 wherein said first set of at least one pin providing access to a row address strobe signal further comprises:

pins 1 and 61 which provide access to a row address strobe signal generated by the system and accepted by the memory device that indicate that a row address is on the address line.

22. The computer system of claim 20 wherein said first set of at least one pin providing the memory device with access to ground followed in sequence by said first set of at least one pin providing access data signal located in or to be stored in a predetermined memory array address location followed in sequence by said first set of at least one pin providing access to said power supply followed in sequence by said first set of at least one pin providing access to a column address strobe signal further comprises:

pin 2 which provides the memory device with access to ground;

pins 3–10 which provide access to a signal generated by the memory device that contains data located in a memory array address location during a read cycle and provide access to a signal generated by the system that contains data to be stored in said memory device during a write cycle;

pin 11 which provides access to a power supply from the system and accepted by the memory device;

pin 12 which provides access to a column address strobe signal generated by the system that indicates to the memory device that a column address is on the address line;

pin 36 which provide the memory device with access to ground;

pins 37–44 which provide access to a signal generated by the memory device that contains data located in said memory array address location during a read cycle and provide access to a signal generated by the system that contains data to be stored in said memory device during a write cycle;

pins 45–46 which provide access to a power supply from the computer and accepted by the memory device;

pin 47 which provides access to a column address strobe signal generated by the system that indicates to the memory device that a column address is on the address line;

pin 62 which provides the memory device with access to ground;

pins 63–70 which provide access to a signal generated by the memory device that contains data located in said memory array address location during a read cycle and provide access to a signal generated by the system that contains data to be stored in said memory device during a write cycle;

pin 71 which provides access to a power supply from the computer and accepted by the memory device; and pin 72 which provides access to a column address strobe signal generated by the system that indicates to the memory device that a column address is on the address line.

23. The computer system of claim 20 wherein said second set of at least one pin providing access to said power supply followed in sequence by said first set of at least one pin providing access to a memory output enable signal followed in sequence by said third set of at least one pin providing access to said power supply further comprises:

pin 13 which provides access to a power supply from the system and accepted by the memory device;

pin 14 which provides access to a memory output enable signal generated by the system and accepted by the memory device; and pin 15 which provides access to a power supply from the system and accepted by the memory device.

24. The computer system of claim 20 wherein said fourth set of at least one pin providing access to said power supply followed in sequence by said second set of at least one pin providing access to a data signal located in or to be stored in a predetermined memory array address location followed in sequence by said second set of at least one pin providing access to ground further comprises:

pin 16 which provides access to a power supply from the system and accepted by the memory device;

pins 17–24 which provide access to a signal generated by the memory device that contains data located in said memory array address location during a read cycle and provide access to a signal generated by the system that contains data to be stored in said memory device during a write cycle;

pin 25 which provides the memory device with access to ground;

pin 50 which provides access to a power supply from the system and accepted by the memory device;

pins 51–58 which provide access to a signal generated by the memory device that contains data located in said memory array address location during a read cycle and provide access to a signal generated by the system that contains data to be stored in said memory device during a write cycle;

pin 59 which provides the memory device with access to ground;

pins 108–110 which provide access to a power supply from the system and accepted by the memory device;

pins 111–118 which provide access to a signal generated by the memory device that contains data located in said memory array address location during a read cycle and provide access to a signal generated by the system that contains data to be stored in said memory device during a write cycle; and pin 119 which provides the memory device with access to ground.

25. The computer system of claim 20 wherein said third set of at least one pin providing the memory device with access to ground followed in sequence by said first set of at least one pin providing access to a predetermined address signal followed in sequence by said fourth set of at least one pin providing access to ground further comprises:

pin 26 which provides the memory device with access to ground;

pins 27–29 which provide access to a signal generated by the system and accepted by the memory device indicating the memory array address location within the memory device to be accessed;

pins 30–31 which provide the memory device with access to ground;

pins 32–34 which provide access to a signal generated by the system and accepted by the memory device that indicates to the memory device the memory array address location within the memory device to be accessed;

pin 35 which provide the memory device with access to ground;

pin 86 which provides the memory device with access to ground;

pins 87–89 which provide access to a signal generated by the system and accepted by the memory device indicating the memory array address location within the memory device to be accessed;

pins 90–91 which provide the memory device with access to ground;

pins 92–93 which provide access to a signal generated by the system and accepted by the memory device indicating the memory array address location within the memory device to be accessed; and pin 95 which provides the memory device with access to ground.

26. The computer system of claim 20 wherein said fifth set of at least one pin providing access to said power supply followed in sequence by said first set of at least one pin providing access to a memory write enable signal further comprises:

pin 48 which provides access to a power supply from the system and accepted by the memory device; and pin 49 which provides access to a memory write enable signal generated by the system and accepted by the memory device.

27. The computer system of claim 20 wherein said sixth set of at least one pin providing access to said power supply followed in sequence by said third set of at least one pin providing access to a predetermined data signal located in or to be stored in a predetermined memory array address location followed in sequence by said first set of at least one pin providing access to parity data further comprises:

pins 73–76 which provide access to a power supply from the computer and accepted by the memory device;

pins 77–84 which provide access to a signal generated by the memory device that contains data located in said memory array address location during a read cycle and provide access to a signal generated by the system that contains data to be stored in said memory device during a write cycle; and pin 85 which provides access to a parity bit.

28. The computer system of claim 20 wherein said second set of at least one pin providing access to parity data followed in sequence by said second set of at least one pin providing access to a predetermined data signal located in or to be stored in a predetermined memory array address location followed in sequence by said seventh set of at least one pin providing access to said power supply further comprises:

pin 96 which provides access to a parity bit;

pins 97–104 which provide access to a signal generated by the memory device that contains data located in said memory array address location during a read cycle and provide access to a signal generated by the system that contains data to be stored in said memory device during a write cycle;

pins 105–106 which provide access to a power supply from the system and accepted by the memory device; and pin 107 which provides access to a column address strobe signal generated by the system that indicates to the memory device that a column address is on the address line.

29. The computer system of claim 20 further comprising:

pins 60, 94 and 120 which are left unconnected and reserved for future expansion of the memory device.

30. The computer system of claim 20 wherein said housing has side socket interface portions with a minimum width of approximately 3.3 mm.

31. The computer system of claim 20 wherein said housing has a top socket interface portion with a maximum thickness of approximately 3.5 mm and a minimum height of approximately 3.0 mm.

32. The computer system of claim 20 wherein said housing has a bottom socket interface portion with a maximum thickness of approximately 5.0 mm and a minimum height of approximately 10.5 mm.

* * * * *

UNITED STATES PATENT AND TRADEMARK OFFICE
CERTIFICATE OF CORRECTION

PATENT NO. : 5,504,700
DATED : April 2, 1996
INVENTOR(S) : Insley et al.

It is certified that errors appear in the above-identified patent and that said Letters Patent is hereby corrected as shown below:

In column 4 at line 21, please delete " 9.10 " and insert -- 210 --.

In column 4 at line 32, please delete " 9.10 " and insert -- 210 --.

Signed and Sealed this

Eighth Day of October, 1996

Attest:

BRUCE LEHMAN

Attesting Officer          Commissioner of Patents and Trademarks